(12) United States Patent
Ito et al.

(10) Patent No.: US 12,278,596 B2
(45) Date of Patent: Apr. 15, 2025

(54) CIRCUIT UNIT AND VIBRATOR DEVICE

(71) Applicant: SEIKO EPSON CORPORATION, Tokyo (JP)

(72) Inventors: Hisahiro Ito, Minowa (JP); Saneyuki Imamura, Minowa (JP); Akio Tsutsumi, Chino (JP)

(73) Assignee: SEIKO EPSON CORPORATION (JP)

( * ) Notice: Subject to any disclaimer, the term of this patent is extended or adjusted under 35 U.S.C. 154(b) by 4 days.

(21) Appl. No.: 18/354,988

(22) Filed: Jul. 19, 2023

(65) Prior Publication Data

US 2024/0030871 A1 Jan. 25, 2024

(30) Foreign Application Priority Data

Jul. 22, 2022 (JP) .................................. 2022-116980

(51) Int. Cl.
*H03B 5/36* (2006.01)
*H03H 9/05* (2006.01)
*H10N 30/88* (2023.01)

(52) U.S. Cl.
CPC ........... *H03B 5/364* (2013.01); *H03H 9/0547* (2013.01); *H10N 30/88* (2023.02)

(58) Field of Classification Search
CPC ...... H03B 5/364; H10N 30/88; H03H 9/0547; H03H 9/1021
USPC ............................ 331/158, 116 FE, 183, 175
See application file for complete search history.

(56) References Cited

U.S. PATENT DOCUMENTS 7,418,614 B2 * 8/2008 Shirotori ................... G06F 1/14
331/65

FOREIGN PATENT DOCUMENTS

JP 2008-042264 A 2/2008

* cited by examiner

*Primary Examiner* — Arnold M Kinkead
(74) *Attorney, Agent, or Firm* — Harness, Dickey & Pierce, P.L.C.

(57) ABSTRACT

A circuit unit includes a first terminal functioning as a power supply terminal or a voltage input terminal, to which a first voltage is applied, a second terminal to which a second voltage is applied, an oscillation circuit oscillating a vibrator, a first switch electrically coupling or decoupling the first terminal and the oscillation circuit, a second switch electrically coupling or decoupling the second terminal and the oscillation circuit, and a selection circuit controlling the first switch and the second switch based on the first voltage and supplying one of the first voltage and the second voltage as a power supply voltage to the oscillation circuit.

9 Claims, 10 Drawing Sheets

CIRCUIT UNIT AND VIBRATOR DEVICE

The present application is based on, and claims priority from JP Application Serial Number 2022-116980, filed Jul. 22, 2022, the disclosure of which is hereby incorporated by reference herein in its entirety.

BACKGROUND

1. Technical Field

The present disclosure relates to a circuit unit and a vibrator device.

2. Related Art

JP-A-2008-042264 discloses an oscillator that does not require measures such as newly increasing a wiring pattern and may prevent hindrance of reduction in height by switching a function assignment between a power supply terminal and a ground terminal of an integrated circuit element regardless of whether wire bonding or FCB is used when the integrated circuit element is mounted on a base. JP-A-2008-042264 discloses switching by a switch portion as an example of selecting the assignment of the terminals.

In the oscillator disclosed in JP-A-2008-042264, it is necessary to provide the switch portion to perform switching operation and set one state of a state in which one terminal of the integrated circuit element is used as a ground terminal and the other terminal is used as a power supply terminal and a state in which the one terminal is used as the power terminal and the other terminal is used as the ground terminal in e.g., a memory of the integrated circuit element.

SUMMARY

An aspect of a circuit unit according to the present disclosure includes a first terminal functioning as a power supply terminal or a voltage input terminal, to which a first voltage is applied, a second terminal to which a second voltage is applied, an oscillation circuit oscillating a vibrator, a first switch electrically coupling or decoupling the first terminal and the oscillation circuit, a second switch electrically coupling or decoupling the second terminal and the oscillation circuit, and a selection circuit controlling the first switch and the second switch based on the first voltage and supplying one of the first voltage and the second voltage as a power supply voltage to the oscillation circuit.

An aspect of a vibrator device according to the present disclosure includes a vibrator, a circuit unit electrically coupled to the vibrator, and a container housing the vibrator and the circuit unit and provided with a first external terminal and a second external terminal, wherein the circuit unit includes a first terminal electrically coupled to the first external terminal and functioning as a power supply terminal or a voltage input terminal, to which a first voltage is applied, a second terminal electrically coupled to the second external terminal, to which a second voltage is applied, an oscillation circuit oscillating the vibrator, a first switch electrically coupling or decoupling the first terminal and the oscillation circuit, a second switch electrically coupling or decoupling the second terminal and the oscillation circuit, and a selection circuit controlling the first switch and the second switch based on the first voltage and supplying one of the first voltage and the second voltage as a power supply voltage to the oscillation circuit.

DESCRIPTION OF EXEMPLARY EMBODIMENTS

As below, preferred embodiments of the present disclosure will be explained in detail using the drawings. The embodiments to be described later do not unduly limit the present disclosure described in What is Claimed is. Further, not all configurations to be described later are essential component elements of the present disclosure.

As below, an oscillator will be described as an example of a vibrator device according to the present disclosure, however, the vibrator device according to the present disclosure may be another type of device including a vibrator, e.g., a sensor or the like.

1. First Embodiment

Figure 1:
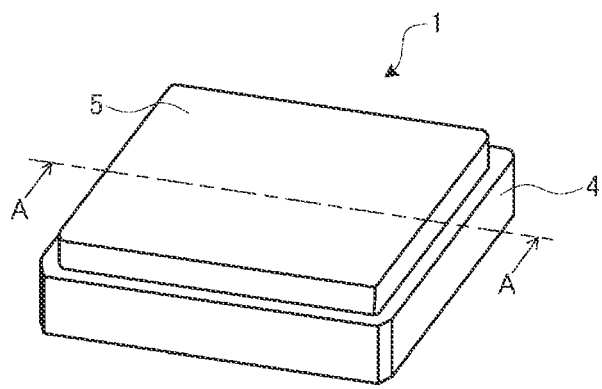
FIG. 1 is a perspective view of an oscillator.
Figure 2:
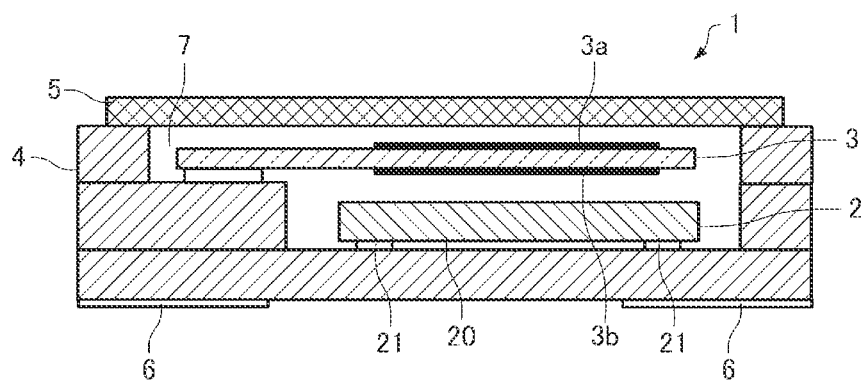
FIG. 2 is a sectional view of the oscillator.
Figure 3:
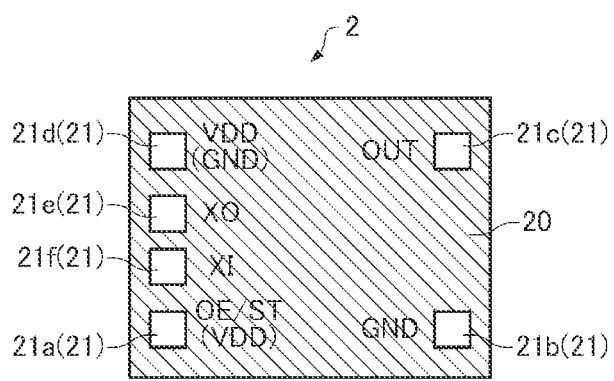
FIG. 3 is a bottom view of a circuit unit.
Figure 4:
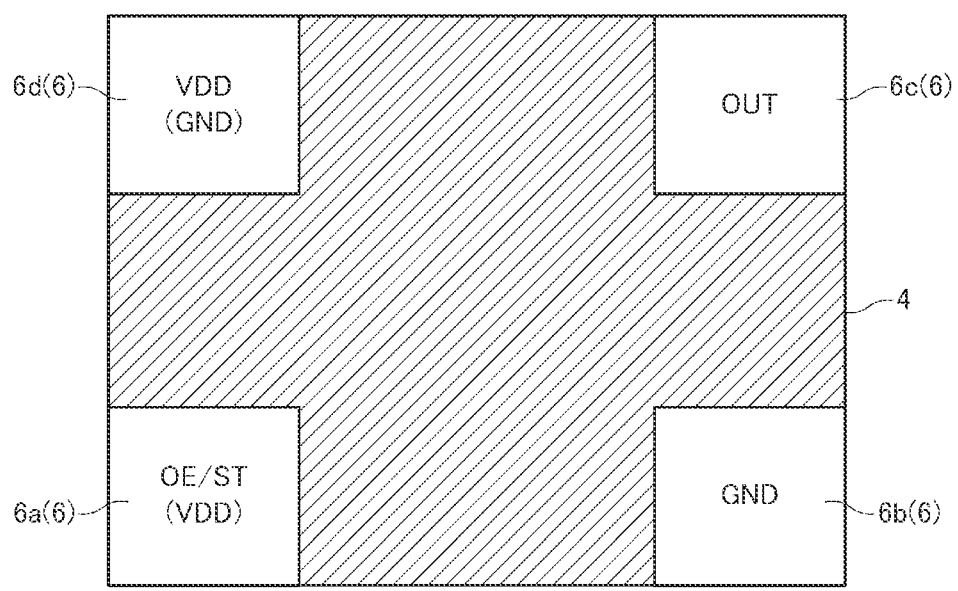
FIG. 4 is a bottom view of the oscillator.

FIGS. 1 to 4 show an example of a structure of an oscillator 1 of the embodiment. FIG. 1 is a perspective view of the oscillator 1, FIG. 2 shows an example of a sectional view along A-A in FIG. 1. FIG. 3 is a bottom view of a circuit unit 2 contained in the oscillator 1, and FIG. 4 is a bottom view of the oscillator 1.

As shown in FIGS. 1 to 4, the oscillator 1 includes the circuit unit 2, a vibrator 3, a container 4, a lid 5, and a plurality of external terminals 6.

In the embodiment, the vibrator 3 is a quartz crystal vibrator using quartz crystal as a substrate material e.g., an AT cut quartz crystal vibrator, a tuning fork type quartz crystal vibrator, or the like. The vibrator 3 may be an SAW vibrator or a MEMS vibrator. SAW is an abbreviation for Surface Acoustic Wave and MEMS is an abbreviation for Micro Electro Mechanical Systems. Or, as the substrate material of the vibrator 3, not only the quartz crystal but also a piezoelectric material such as a piezoelectric single crystal such as lithium tantalate or lithium niobate, piezoelectric ceramics such as lead zirconate titanate, a silicon semiconductor material, or the like may be used. As exciting means for the vibrator 3, a piezoelectric effect may be used or electrostatic drive by Coulomb's force may be used. Further, in the embodiment, the circuit unit 2 is realized by a one-chip integrated circuit. Note that the circuit unit 2 may be formed at least partially by a discrete component.

As shown in FIG. 2, the vibrator 3 has metal excitation electrodes 3a, 3b on a front surface and a back surface thereof, respectively, and oscillates at a desired frequency according to the shape and the mass of the vibrator 3 including the excitation electrodes 3a, 3b.

As shown in FIG. 2, the oscillator 1 is an oscillator having a single-sealed structure, and the container 4 houses the circuit unit 2 and the vibrator 3 within the same space. For example, the container 4 may be a ceramic package. Specifically, a concave portion is provided in the container 4 and the concave portion is covered by the lid 5 to form a housing chamber 7. Note that the structure shown in FIG. 2 is just an example, and the oscillator 1 may have another structure, e.g., a structure in which the circuit unit 2 and the vibrator 3 are housed in different spaces from each other.

As shown in FIGS. 2 and 3, six terminals 21, i.e., terminals 21a, 21b, 21c, 21d, 21e, 21f are provided on a bottom surface 20 of the circuit unit 2. The terminal 21a is a terminal functioning as a control terminal to which a control signal OE or a control signal ST is input or a power supply terminal to which a power supply voltage VDD is supplied. The terminal 21b is a ground terminal to which a ground voltage GND is supplied. The terminal 21c is an output terminal from which a clock signal OUT is output. The terminal 21d is a terminal functioning as a power supply terminal to which the power supply voltage VDD is supplied or a voltage input terminal to which the ground voltage GND is supplied. The terminal 21e is an input terminal to which a signal XO from the vibrator 3 is input. The terminal 21f is an output terminal from which a signal XI is output to the vibrator 3.

As shown in FIG. 4, in the oscillator 1, four external terminals 6, i.e., external terminals 6a, 6b, 6c, 6d are provided on a back surface as a bottom surface of the container 4. The external terminal 6a is a terminal functioning as a control terminal to which the control signal OE or the control signal ST is input or a power supply terminal to which the power supply voltage VDD is supplied. The external terminal 6b is a ground terminal to which the ground voltage GND is supplied. The external terminal 6c is an output terminal from which the clock signal OUT is output. The external terminal 6d is a terminal functioning as a power supply terminal to which the power supply voltage VDD is supplied or a voltage input terminal to which the ground voltage GND is supplied.

Inside of the container 4 or on a front surface of the concave portion, wires (not shown) electrically coupling the two terminals 21e, 21f of the circuit unit 2 and the two excitation electrodes 3a, 3b of the vibrator 3, respectively, are provided. By the wires, the circuit unit 2 is electrically coupled to the vibrator 3. Further, inside of the container 4 or on the front surface of the concave portion, wires (not shown) electrically coupling the four terminals 21a, 21b, 21c, 21d of the circuit unit 2 and the four external terminals 6a, 6b, 6c, 6d of the oscillator 1, respectively, are provided.

Figure 5:
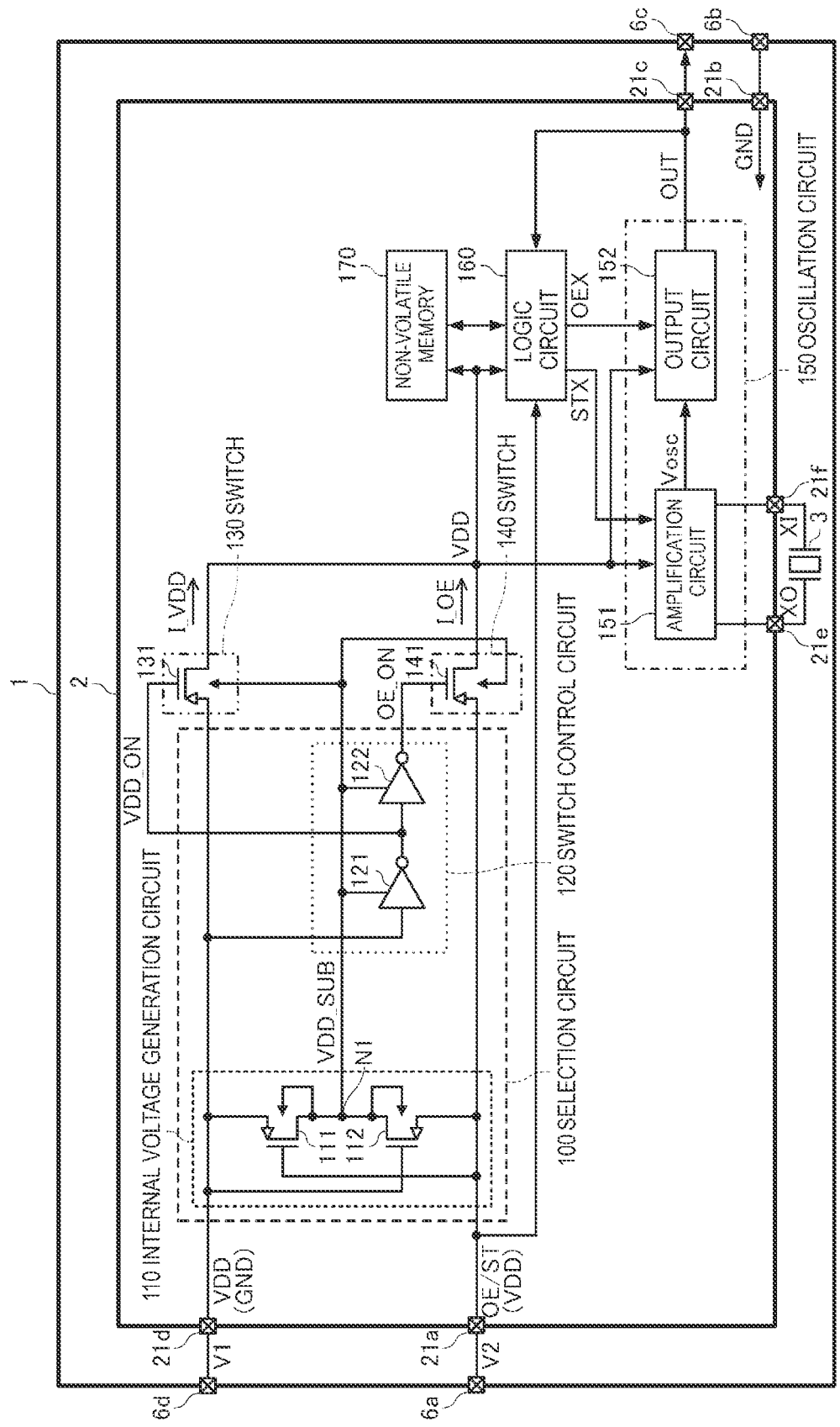
FIG. 5 is a functional block diagram of an oscillator of a first embodiment.

FIG. 5 is a functional block diagram of the oscillator 1 of a first embodiment. As shown in FIG. 5, the oscillator 1 of the first embodiment includes the circuit unit 2 and the vibrator 3. As described above, the oscillator 1 includes the four external terminals 6a, 6b, 6c, 6d and the circuit unit 2 includes the six terminals 21a, 21b, 21c, 21d, 21e, 21f. The four terminals 21a, 21b, 21c, 21d of the circuit unit 2 are electrically coupled to the four external terminals 6a, 6b, 6c, 6d of the oscillator 1, respectively. The terminal 21e of the circuit unit 2 is electrically coupled to one end of the vibrator 3 and the terminal 21f of the circuit unit 2 is electrically coupled to the other end of the vibrator 3.

The circuit unit 2 includes a selection circuit 100, a switch 130, a switch 140, an oscillation circuit 150, a logic circuit 160, and a non-volatile memory 170. Note that the circuit unit 2 may have a configuration in which part of these elements are omitted or changed or another element is added.

The terminal 21d of the circuit unit 2 functions as the power supply terminal or the voltage input terminal and a voltage V1 is applied thereto. When the terminal 21d is the power supply terminal, the voltage V1 is the power supply voltage VDD. The power supply voltage VDD is e.g., 3.3 V. Or, when the terminal 21d is the voltage input terminal, the voltage V1 is the ground voltage GND. The ground voltage GND is e.g., 0 V.

The terminal 21a of the circuit unit 2 functions as the control terminal or the power supply terminal and a voltage V2 is applied thereto. When the terminal 21a is the control terminal, the voltage V2 is the voltage of the control signal OE or the control signal ST. The voltages of the control signals OE, ST are the power supply voltage VDD or the ground voltage GND. When the terminal 21a is the control terminal, information representing whether the signal input to the terminal 21a is the control signal OE or the control signal ST is stored in the non-volatile memory 170. When the terminal 21a is the power supply terminal, the voltage V2 is the power supply voltage VDD.

When the terminal 21d is the power supply terminal, the terminal 21a is the control terminal. Alternatively, when the terminal 21d is the voltage input terminal, the terminal 21a is the power supply terminal.

The selection circuit 100 controls the switch 130 and the switch 140 based on the voltage V1 applied to the terminal 21d, and supplies one of the voltage V1 applied to the terminal 21d and the voltage V2 applied to the terminal 21a as the power supply voltage VDD to the oscillation circuit 150. In the embodiment, the selection circuit 100 includes an internal voltage generation circuit 110 and a switch control circuit 120.

The internal voltage generation circuit 110 generates an internal voltage VDD_SUB based on the voltage V1 applied to the terminal 21d and the voltage V2 applied to the terminal 21a. In the embodiment, the internal voltage generation circuit 110 includes two PMOS transistors 111, 112.

The source of the PMOS transistor 111 is coupled to the terminal 21d and the gate thereof is coupled to the terminal 21a. The source of the PMOS transistor 112 is coupled to the terminal 21a and the gate thereof is coupled to the terminal 21d. Further, the drain of the PMOS transistor 111 and the drain of the PMOS transistor 112 are coupled at a node N1.

When the terminal 21d is the power supply terminal, the voltage V1 applied to the terminal 21d is the power supply voltage VDD and the PMOS transistor 112 is off. In this case, the terminal 21a is the control terminal and the voltage V2 applied to the terminal 21a is the power supply voltage VDD or the ground voltage GND. When the voltage V2 is the ground voltage GND, the PMOS transistor 111 is on and the voltage at the node N1 is the power supply voltage VDD as the voltage V1. When the voltage V2 is the power supply voltage VDD, the PMOS transistor 111 is off, however, a current flows from the source to the drain by a parasitic diode formed between the source and the drain of the PMOS transistor 111 and the voltage at the node N1 is the power supply voltage VDD as the voltage V1. That is, when the terminal 21d is the power supply terminal, the voltage at the node N1 is the power supply voltage VDD.

On the other hand, when the terminal 21d is the voltage input terminal, the voltage V1 applied to the terminal 21d is the ground voltage GND and the PMOS transistor 112 is on. In this case, the terminal 21a is the power supply terminal and the voltage V2 applied to the terminal 21a is the power supply voltage VDD and the PMOS transistor 111 is off. Therefore, the voltage at the node N1 is the power supply voltage VDD as the voltage V2. That is, when the terminal 21d is the voltage input terminal, also, the voltage at the node N1 is the power supply voltage VDD.

The internal voltage VDD_SUB is the voltage at the node N1 and supplied to the switch control circuit 120, the switch 130, and the switch 140.

The switch control circuit 120 operates by the internal voltage VDD_SUB and controls the switch 130 and the switch 140. In the embodiment, the switch control circuit 120 includes two logic inverting circuits 121, 122.

The input terminal of the logic inverting circuit 121 is coupled to the terminal 21d. The logic inverting circuit 121 is supplied with the internal voltage VDD_SUB and operates and outputs a signal formed by logical inversion of the voltage V1 applied to the terminal 21d. The output terminal of the logic inverting circuit 121 is coupled to the input terminal of the logic inverting circuit 122.

The logic inverting circuit 122 is supplied with the internal voltage VDD_SUB and operates and outputs a signal formed by logical inversion of the signal output from the logic inverting circuit 121.

The switch 130 electrically couples or decouples the terminal 21d and the oscillation circuit 150. In the embodiment, the switch 130 includes a PMOS transistor 131.

In the PMOS transistor 131, the internal voltage VDD_SUB is supplied to the back gate, the source is coupled to the terminal 21d, and the gate is coupled to the output terminal of the logic inverting circuit 121. Further, the output signal of the logic inverting circuit 121 is input as a control signal VDD_ON to the gate of the PMOS transistor 131.

The switch 140 electrically couples or decouples the terminal 21a and the oscillation circuit 150. In the embodiment, the switch 140 includes a PMOS transistor 141.

In the PMOS transistor 141, the internal voltage VDD_SUB is supplied to the back gate, the source is coupled to the terminal 21a, and the gate is coupled to the output terminal of the logic inverting circuit 122. Further, the output signal of the logic inverting circuit 122 is input as a control signal OE_ON to the gate of the PMOS transistor 141.

When the terminal 21d is the power supply terminal, the voltage V1 applied to the terminal 21d is the power supply voltage VDD, and the control signal VDD_ON is at the low level and the control signal OE_ON is at the high level. As a result, the source and the drain of the PMOS transistor 131 are conductive and the terminal 21d and the oscillation circuit 150 are electrically coupled, and the source and the drain of the PMOS transistor 141 are non-conductive and the terminal 21a and the oscillation circuit 150 are electrically decoupled. Therefore, the power supply voltage VDD is supplied from the terminal 21d to the oscillation circuit 150 via the PMOS transistor 131 and the oscillation circuit 150 operates.

On the other hand, when the terminal 21d is the voltage input terminal, the voltage V1 applied to the terminal 21d is the ground voltage GND and the control signal VDD_ON is at the high level and the control signal OE_ON is at the low level. As a result, the source and the drain of the PMOS transistor 141 are conductive and the terminal 21a and the oscillation circuit 150 are electrically coupled, and the source and the drain of the PMOS transistor 131 are non-conductive and the terminal 21a and the oscillation circuit 150 are electrically decoupled. In this regard, the terminal 21a is the power supply terminal, and the voltage V2 applied to the terminal 21a is the power supply voltage VDD. Therefore, the power supply voltage VDD is supplied from the terminal 21a to the oscillation circuit 150 via the PMOS transistor 141 and the oscillation circuit 150 operates.

As described above, regardless of whether the terminal 21d is the power supply terminal or the voltage input terminal, the power supply voltage VDD is supplied to the oscillation circuit 150 and the oscillation circuit 150 operates. Note that the power supply voltage VDD is also supplied to the logic circuit 160 and the non-volatile memory 170.

The oscillation circuit 150 oscillates the vibrator 3 and generates the clock signal OUT. In the embodiment, the oscillation circuit 150 includes an amplification circuit 151 and an output circuit 152. The amplification circuit 151 and the output circuit 152 are supplied with the power supply voltage VDD from the selection circuit 100 via the switch 130 or the switch 140 and operates.

The amplification circuit 151 is electrically coupled to ends of the vibrator 3 via the two terminals 21e, 21f, and oscillates the vibrator 3 at a desired frequency and outputs an oscillation signal Vosc. Specifically, the signal XO output from the one end of the vibrator 3 is input via the terminal 21e, and the amplification circuit 151 supplies the signal XI formed by amplification of the signal XO to the other end of the vibrator 3 via the terminal 21f.

The amplification circuit 151 may be e.g., a voltage-driven circuit using a logic inverting circuit or the like or a current-driven circuit using a bipolar transistor or the like. When the amplification circuit 151 is the current-driven circuit, a current I_VDD is supplied from the terminal 21d via the PMOS transistor 131 or a current I_OE is supplied from the terminal 21a via the PMOS transistor 141 to the amplification circuit 151.

When the terminal 21a is the control terminal to which the control signal ST is input, a control signal STX is input from the logic circuit 160 to the amplification circuit 151. The amplification circuit 151 operates when the control signal STX is inactive and outputs the oscillation signal Vosc and stops the operation when the control signal STX is active.

The oscillation signal Vosc is input to the output circuit 152. The output circuit 152 outputs the clock signal OUT based on the oscillation signal Vosc. For example, the output circuit 152 may output the clock signal OUT divided at a division ratio set in the non-volatile memory 170 or output the clock signal OUT of an output type set in the non-volatile memory 170 based on a control signal (not shown) input from the logic circuit 160. The output type of the clock signal OUT may be e.g., CMOS output or clipped sign output. CMOS is an abbreviation for Complementary Metal Oxide Semiconductor. Or, the output circuit 152 may output the clock signal OUT with output power set in the non-volatile memory 170 based on a control signal (not shown) input from the logic circuit 160.

When the terminal 21a is the control terminal to which the control signal OE is input, a control signal OEX is input from the logic circuit 160 to the output circuit 152. The output circuit 152 outputs the clock signal OUT when the control signal OEX is active and stops the output of clock signal OUT when the control signal OEX is inactive.

The logic circuit 160 controls operations of the respective circuits. Specifically, the logic circuit 160 is coupled to the two terminals 21a, 21c of the circuit unit 2, sets an operation mode of the oscillator 1 or the circuit unit 2 to one of a plurality of modes including an external communication mode and a normal operation mode based on the signals input to the terminals 21a, 21c, and performs control according to the set operation mode. In the embodiment, when a signal having a predetermined pattern is input from the terminal 21a within a predetermined period after the supply of the power supply voltage VDD to the terminal 21d is started, the logic circuit 160 sets the operation mode to the external communication mode after a lapse of the predetermined period. For example, the logic circuit 160 may use a period after the vibrator 3 starts oscillation by the supply of the power supply voltage VDD and before the stabilized oscillation is detected as the predetermined period or count the pulse number of the oscillation signal Vosc and determine that the predetermined period elapses when the count value reaches a predetermined value. Or, for example, the logic circuit 160 may measure the predetermined period based on an output signal of an RC time constant circuit that starts operation by the supply of the power supply voltage VDD.

In the external communication mode, the logic circuit 160 may perform data communications with an external device (not shown) coupled to the two external terminals 6a, 6c of the oscillator 1 via the two terminals 21a, 21c. The external device outputs a serial clock signal to the external terminal 6c, outputs a serial data signal to the external terminal 6a or acquire a signal output from the logic circuit 160 to the external terminal 6a via the terminal 21a in synchronization with the serial clock signal according to a predetermined communication standard. In the external communication mode, the logic circuit 160 samples the serial data signals as various commands with respect to each edge of the serial clock signal compliant to e.g., a standard for I2C bus. I2C is an abbreviation for Inter-Integrated Circuit. Then, the logic circuit 160 performs setting of the operation mode and processing of writing and reading data in and out of the non-volatile memory 170 based on the sampled commands. Note that, in the embodiment, for example, the logic circuit 160 communicates with an external device at a communication standard for two-wire bus such as an I2C bus, however, may communicate with an external device at a communication standard for three-wire bus or four-wire bus such as an SPI bus. SPI is an abbreviation for Serial Peripheral Interface.

Figure 6:
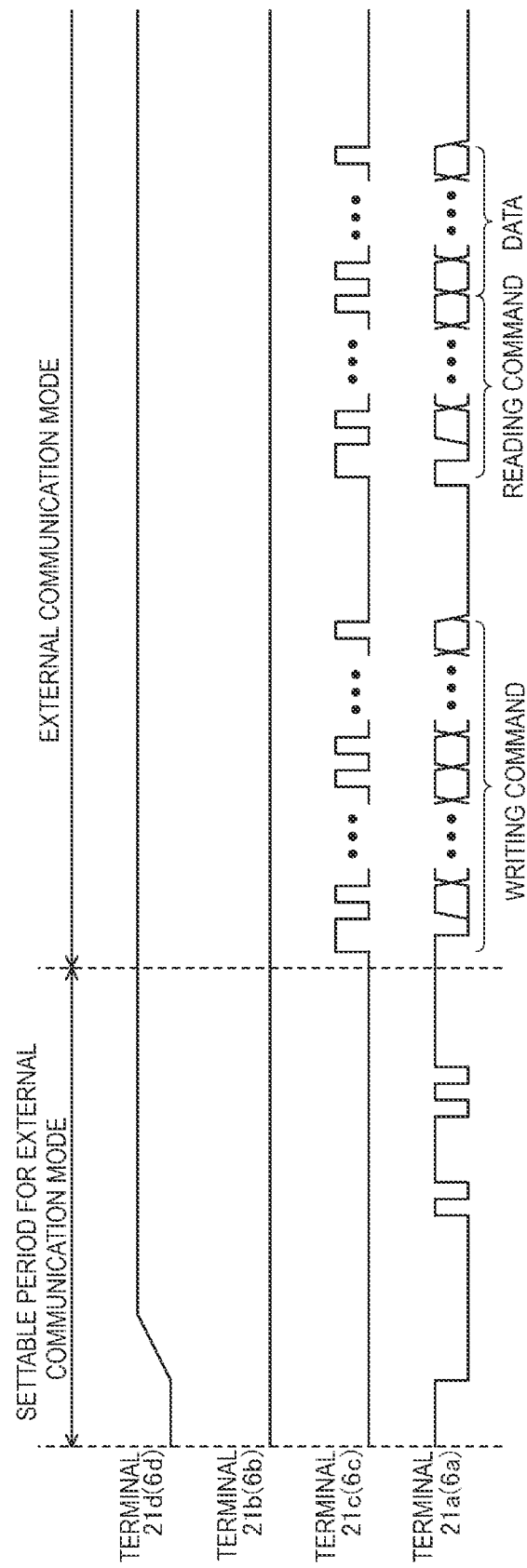
FIG. 6 shows an example of a timing chart of writing and reading data in and out of a non-volatile memory.

For example, when sampling a writing command in the non-volatile memory 170 in the external communication mode, the logic circuit 160 writes data designated in the writing command in an address of the non-volatile memory 170 designated in the writing command. Further, when sampling a reading command out of the non-volatile memory 170 in the external communication mode, the logic circuit 160 reads data from an address of the non-volatile memory 170 designated in the reading command and converts the data into serial data and outputs the data. FIG. 6 shows an example of a timing chart when the supply of the power supply voltage VDD to the terminal 21d is started and the operation mode is shifted to the external communication mode, and then, writing and reading of data in and out of the non-volatile memory 170 are performed in the external communication mode.

Furthermore, for example, when sampling a normal operation mode setting command in the external communication mode, the logic circuit 160 shifts the operation mode from the external communication mode to the normal operation mode. Note that, when the signal having the predetermined pattern is not input from the terminal 21a within the predetermined period after the supply of the power supply voltage VDD to the terminal 21d is started, the logic circuit 160 sets the operation mode directly to the normal operation mode without setting the operation mode to the external communication mode after a lapse of the predetermined period. In the normal operation mode, the terminal 21d functions as the power supply terminal or the voltage input terminal and the terminal 21a functions as the control terminal or the power supply terminal.

In the normal operation mode, when the power supply voltage VDD as the voltage V1 is input to the terminal 21d and the control signal OE as the voltage V2 is input to the terminal 21a, the logic circuit 160 generates the control signal OEX based on the control signal OE and outputs the signal to the output circuit 152 of the oscillation circuit 150. In this case, the logic circuit 160 generates the control signal STX being constantly inactive and outputs the signal to the amplification circuit 151 of the oscillation circuit 150. Therefore, when the control signal OEX is active, the clock signal OUT is output from the oscillation circuit 150 and, when the control signal OEX is inactive, the output of the clock signal OUT from the oscillation circuit 150 is stopped.

In the normal operation mode, when the power supply voltage VDD as the voltage V1 is input to the terminal 21d and the control signal ST as the voltage V2 is input to the terminal 21a, the logic circuit 160 generates the control signal STX based on the control signal ST and outputs the signal to the amplification circuit 151 of the oscillation circuit 150. In this case, the logic circuit 160 generates the control signal OEX being constantly active and outputs the signal to the output circuit 152 of the oscillation circuit 150. Therefore, when the control signal STX is inactive, the clock signal OUT is output from the oscillation circuit 150 and, when the control signal STX is active, the output of the clock signal OUT from the oscillation circuit 150 is stopped.

As described above, in the normal operation mode, the logic circuit 160 functions as a clock signal output control circuit switching whether the clock signal is output from the oscillation circuit 150 according to the voltage V2. Note that, in the non-volatile memory 170, information representing that the voltage V1 applied to the terminal 21a is the control signal OE or the control signal ST and information representing relationships between polarities of the control signals OE, ST and polarities of the control signals STX, OEX are stored, and the logic circuit 160 outputs the control signals OEX STX, according to the information.

On the other hand, in the normal operation mode, when the ground voltage GND is input to the terminal 21d and the power supply voltage VDD is input to the terminal 21a, the logic circuit 160 generates the control signal STX being constantly inactive and outputs the signal to the amplification circuit 151 of the oscillation circuit 150. Further, the logic circuit 160 generates the control signal OEX being constantly active and outputs the signal to the output circuit 152 of the oscillation circuit 150. Therefore, the clock signal OUT is constantly output from the oscillation circuit 150.

The non-volatile memory 170 is a memory storing various kinds of information e.g., a MONOS-type memory, an EEPROM, or the like. MONOS is an abbreviation for Metal Oxide Nitride Oxide Silicon and EEPROM is an abbreviation for Electrically Erasable Programmable Read-Only Memory. In the manufacturing process of the oscillator 1, various kinds of information for controlling the respective circuits are stored in the non-volatile memory 170. When the power supply voltage VDD is supplied to the oscillator 1, the various kinds of information stored in the non-volatile memory 170 is transferred to a register (not shown) of the logic circuit 160 and the logic circuit 160 generates various control signals based on the various kinds of information stored in the register.

As described above, in the embodiment, the selection circuit 100 controls the switch 130 and the switch 140 based on the voltage V1 applied to the terminal 21d, and supplies one of the voltage V1 applied to the terminal 21d and the voltage V2 applied to the terminal 21a as the power supply voltage VDD to the oscillation circuit 150. On the other hand, there is a conceivable method of storing information representing whether the terminal 21d or 21a is the power supply terminal by the non-volatile memory 170 in the external communication mode and controlling the switch 130 and the switch 140 by reading the information from the non-volatile memory 170 by the logic circuit 160 in the normal operation mode. However, in the method, it may be impossible to determine whether the terminal 21d or 21a is the power supply terminal until the logic circuit 160 reads the information from the non-volatile memory 170, and it may be impossible for the logic circuit 160 to read the information from the non-volatile memory 170 unless whether the terminal 21d or 21a is the power supply terminal is determined. Accordingly, in the method, it may be possible that the power supply voltage VDD applied to one of the terminals 21d, 21a is not normally supplied to the oscillation circuit 150.

On this account, in the embodiment, the selection circuit 100 determines whether the terminal 21d or 21a is the power supply terminal and controls the switch 130 and the switch 140 based on the voltage V1 applied to the terminal 21d, and thereby, the power supply voltage VDD is normally supplied to the oscillation circuit 150.

Further, as described above, in the embodiment, in the selection circuit 100, the internal voltage VDD_SUB generated by the internal voltage generation circuit 110 is supplied to the switch control circuit 120, and the switches 130, 140 are controlled by the control signals VDD_ON, OE_ON generated by the switch control circuit 120. As a result, regardless of whether the power supply voltage VDD is supplied to terminal 21d or 21a, at least one of the switches 130, 140 becomes conductive and the power supply voltage VDD is supplied to the oscillation circuit 150.

Figure 7:
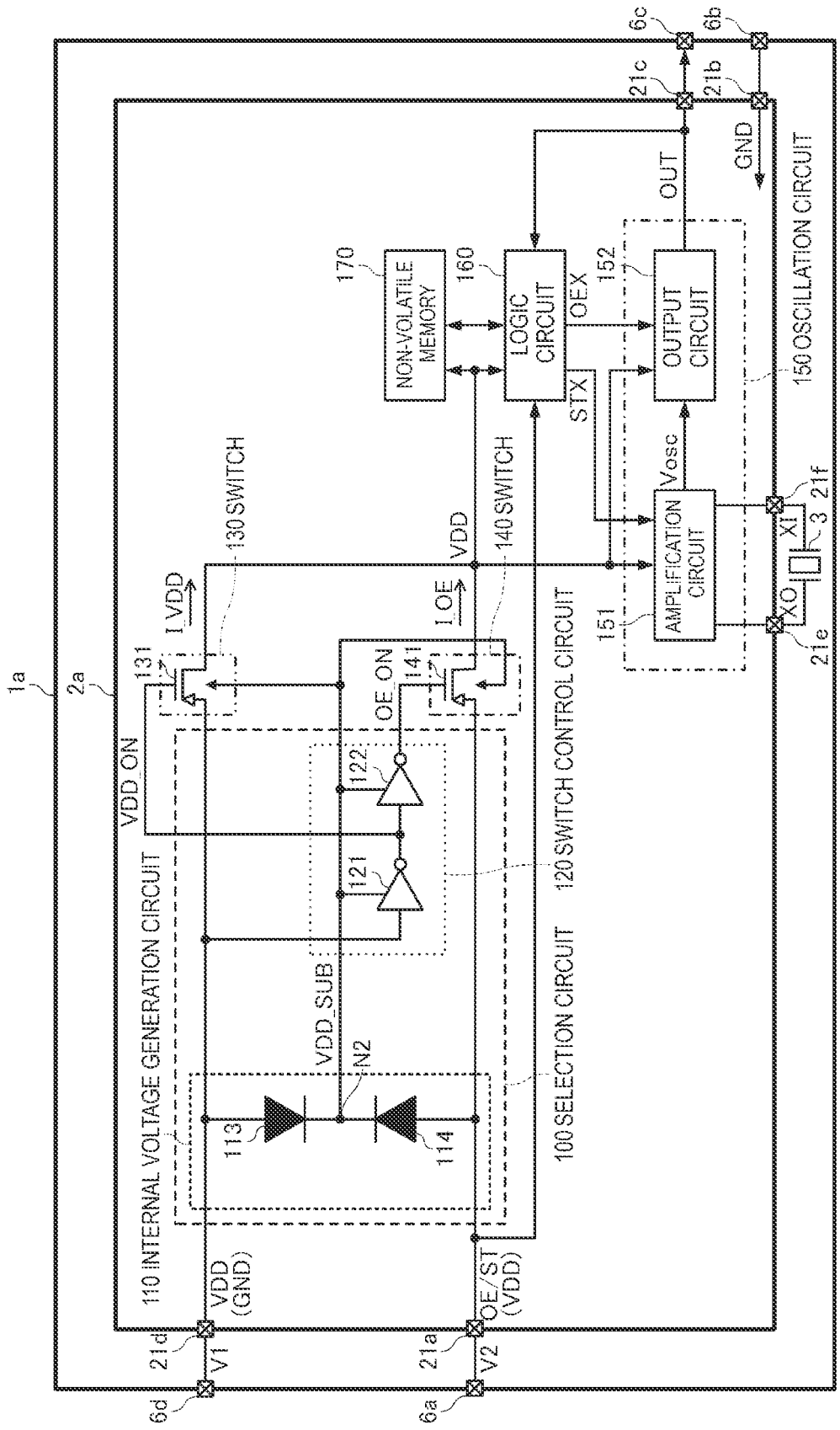
FIG. 7 is a functional block diagram of an oscillator of a comparative example.
Figure 8:
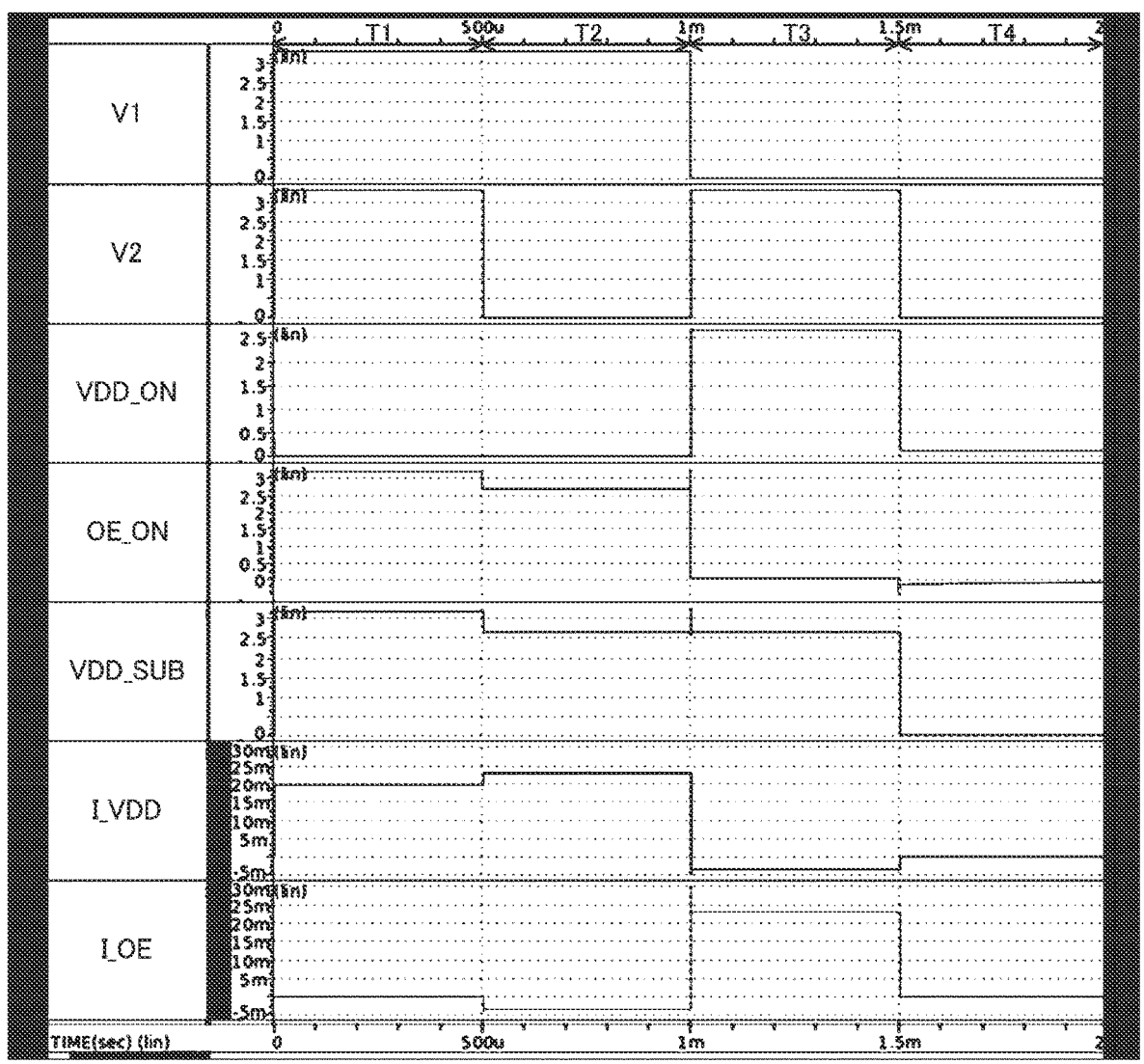
FIG. 8 shows signal waveforms of a simulation result with respect to a circuit unit in the comparative example.

Here, as in a circuit unit 2a of a comparative example provided in an oscillator 1a shown in FIG. 7, the internal voltage generation circuit 110 may include two diodes 113, 114. The anode of the diode 113 is coupled to the terminal 21d, the anode of the diode 114 is coupled to the terminal 21a, and the cathode of the diode 113 and the cathode of the diode 114 are coupled at a node N2. Further, the internal voltage VDD_SUB is the voltage at the node N2. FIG. 8 shows signal waveforms of a simulation result with respect to the circuit unit 2a.

FIG. 8 shows signal waveforms when the terminal 21d functions as the power supply terminal and the terminal 21a functions as the control terminal in periods T1, T2. In the period T1, the voltage V1 applied to the terminal 21d is 3.3 V and the voltage V2 applied to the terminal 21a is 3.3 V. In the period T2, the voltage V1 is 3.3 V and the voltage V2 is 0 V. In a period T3, a signal waveform when the terminal 21d functions as the voltage input terminal and the terminal 21a functions as the power supply terminal is formed. In the period T3, the voltage V1 is 0 V and the voltage V2 is 3.3 V. Note that, in a period T4, signal waveforms when the terminal 21d functions as the voltage input terminal and the terminal 21a functions as the ground terminal are formed, and the period corresponds to when the power of the oscillator 1a is off.

In FIG. 8, in the period T1, both the voltages V1, V2 are 3.3 V, and forward currents flow in the diodes 113, 114 and the internal voltage VDD_SUB becomes about 3.1 V. Further, the voltage V1 is 3.3 V, and the control signal VDD_ON is 0 V and the source and the drain of the PMOS transistor 131 are conductive, a current I_VDD of about 20 mA flows, and the power supply voltage VDD of 3.3 V is supplied to the oscillation circuit 150. On the other hand, the internal voltage VDD_SUB is about 3.1 V, and the control signal OE_ON is about 3.1 V, the gate and the back gate of the PMOS transistor 141 are at about 3.1 V and the source is at 3.3 V and the drain is at 0 V, and the source and the drain are non-conductive. Accordingly, the current I_OE is 0 mA, and a current of about 20 mA as a sum of the current I_VDD of about 20 mA and the current I_OE of 0 mA is supplied to the oscillation circuit 150.

In the period T2, the voltage V1 is 3.3 V and the voltage V2 is 0 V, and a forward current flows in the diode 113, but no current flows in the diode 114 and the internal voltage VDD_SUB is about 2.6 V. Further, the voltage V1 is 3.3 V, and the control signal VDD_ON is 0 V, the source and the drain of the PMOS transistor 131 are conductive, and the power supply voltage VDD of 3.3 V is supplied to the oscillation circuit 150. On the other hand, the internal voltage VDD_SUB is about 2.6 V, and the control signal OE_ON is about 2.6 V, the gate and the back gate of the PMOS transistor 141 are at about 2.6 V, the source is at 3.3 V, and the drain is at 0 V, and the source and the drain are not non-conductive, but slightly conductive and a leak current flows. Accordingly, currents flow from the terminal 21d to the terminal 21a via the PMOS transistors 131, 141, the current I_VDD is about 24 mA and the current I_OE is about −4 mA. A current of about 20 mA as a sum of the current I_VDD of about 24 mA and the current I_OE of about −4 mA is supplied to the oscillation circuit 150.

In the period T3, the voltage V1 is 0 V and the voltage V2 is 3.3 V, and a forward current flows in the diode 114, but no current flows in the diode 113 and the internal voltage VDD_SUB is about 2.6 V. Further, the voltage V1 is 0 V, and the control signal OE_ON is 0 V, the source and the drain of the PMOS transistor 141 are conductive, and the power supply voltage VDD of 3.3 V is supplied to the oscillation circuit 150. On the other hand, the internal voltage VDD_SUB is about 2.6 V, and the control signal VDD_ON is about 2.6 V, the gate and the back gate of the PMOS transistor 131 are at about 2.6 V, the source is at 3.3 V, and the drain is at 0 V, and the source and the drain are not non-conductive, but slightly conductive and a leak current flows. Accordingly, currents flow from the terminal 21a to the terminal 21d via the PMOS transistors 141, 131, the current I_OE is about 24 mA and the current I_VDD is about −4 mA. A current of about 20 mA as a sum of the current I_OE of about 24 mA and the current I_VDD of about −4 mA is supplied to the oscillation circuit 150.

As described above, in the circuit unit 2a of the comparative example, in the periods T2, T3, there is a problem that the leak current flows in the PMOS transistor 141 or the PMOS transistor 131 and current consumption increases.

Figure 9:
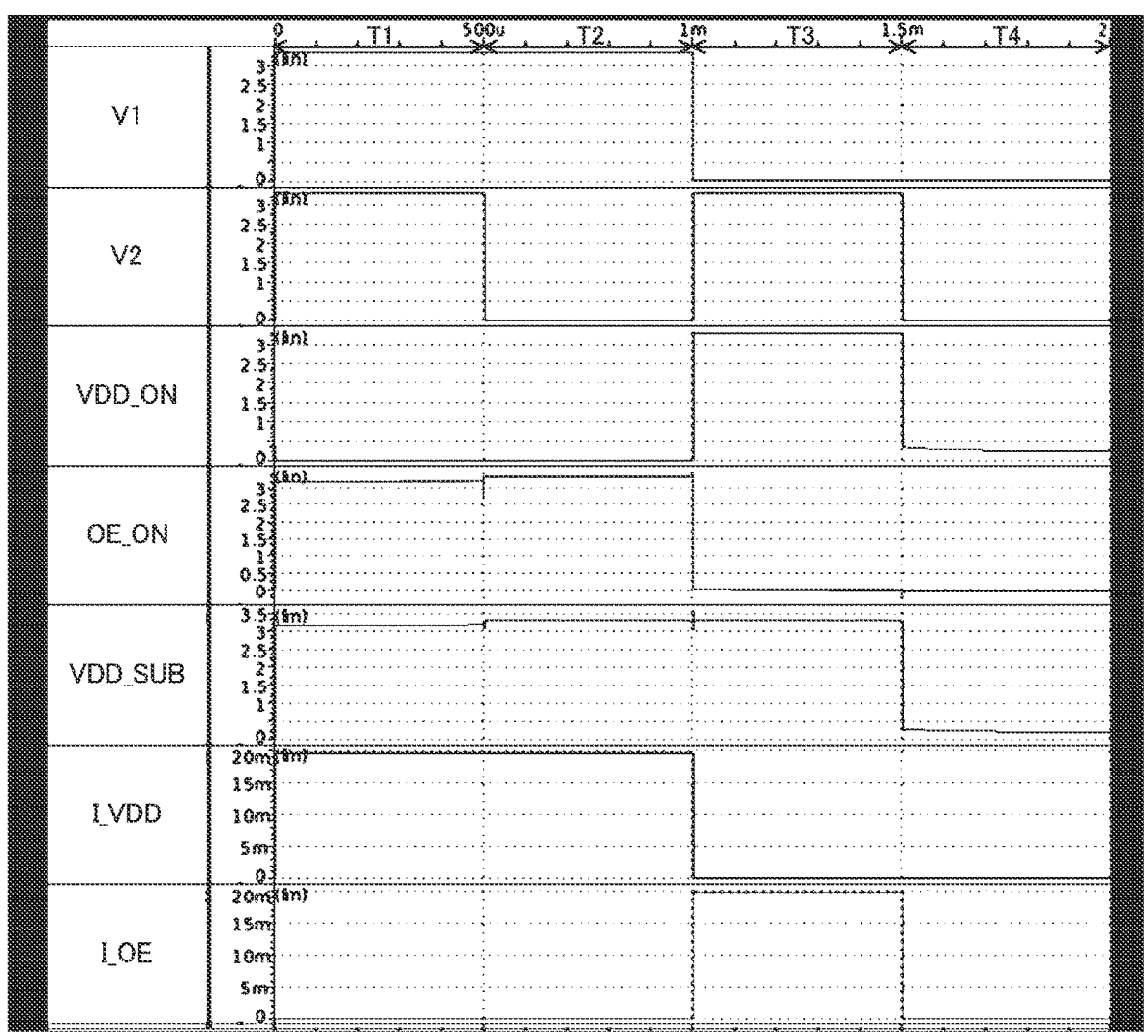
FIG. 9 shows signal waveforms of a simulation result with respect to a circuit unit in the first embodiment.

To solve the problem, in the circuit unit 2 of the embodiment, as described above, the internal voltage generation circuit 110 includes the two PMOS transistors 111, 112. FIG. 9 shows signal waveforms of a simulation result with respect to the circuit unit 2. The waveforms of the voltages V1, V2 in the periods T1 to T4 are the same as those in FIG. 8.

In FIG. 9, in the period T1, both the voltages V1, V2 are 3.3 V and both the PMOS transistors 111, 112 are off, however, currents flow from the terminals 21d, 21a to the node N1 by the parasitic diodes formed between the respective sources and drains of the PMOS transistors 111, 112, and the internal voltage VDD_SUB is about 3.1 V. Further, the voltage V1 is 3.3 V, and the control signal VDD_ON is 0 V and the source and the drain of the PMOS transistor 131 are conductive, the current I_VDD of about mA flows, and the power supply voltage VDD of 3.3 V is supplied to the oscillation circuit 150. On the other hand, the internal voltage VDD_SUB is about 3.1 V, and the control signal OE_ON is about 3.1 V, the gate and the back gate of the PMOS transistor 141 are at about 3.1 V, the source is at 3.3 V, and the drain is at 0 V, and the source and the drain are non-conductive. Accordingly, the current I_OE is mA, and a current of about 20 mA as a sum of the current I_VDD of about 20 mA and the current I_OE of 0 mA is supplied to the oscillation circuit 150.

In the period T2, the voltage V1 is 3.3 V and the voltage V2 is 0 V, and the PMOS transistor 111 is on and the PMOS transistor 112 is off, and the internal voltage VDD_SUB is 3.3 V. Further, the voltage V1 is 3.3 V, and the control signal VDD_ON is 0 V and the source and the drain of the PMOS transistor 131 are conductive, the current I_VDD of about 20 mA flows, and the power supply voltage VDD of 3.3 V is supplied to the oscillation circuit 150. On the other hand, the internal voltage VDD_SUB is 3.3 V, and the control signal OE_ON is 3.3 V, the gate and the back gate of the PMOS transistor 141 are at 3.3 V, the source is at 3.3 V, and the drain is at 0 V, and the source and the drain are non-conductive. Accordingly, the current I_OE is 0 mA, and a current of about 20 mA as a sum of the current I_VDD of about 20 mA and the current I_OE of 0 mA is supplied to the oscillation circuit 150.

In the period T3, the voltage V1 is 0 V and the voltage V2 is 3.3 V, and the PMOS transistor 111 is off and the PMOS transistor 112 is on, and the internal voltage VDD_SUB is 3.3 V. Further, the voltage V1 is 0 V, and the control signal OE_ON is 0 V and the source and the drain of the PMOS transistor 141 are conductive, the current I_OE of about 20 mA flows, and the power supply voltage VDD of 3.3 V is supplied to the oscillation circuit 150. On the other hand, the internal voltage VDD_SUB is 3.3 V, and the control signal VDD_ON is 3.3 V, the gate and the back gate of the PMOS transistor 131 are at 3.3 V, the source is at 3.3 V, and the drain is at 0 V, and the source and the drain are non-conductive. Accordingly, the current I_VDD is 0 mA, and a current of about 20 mA as a sum of the current I_OE of about 20 mA and the current I_VDD of 0 mA is supplied to the oscillation circuit 150.

As described above, in the circuit unit 2, in all of the periods T1, T2, T3, no leak current flows in the PMOS transistor 141 or the PMOS transistor 131 and the problem that the current consumption increases due to the leak current is solved.

Note that, in the first embodiment, the external terminal 6d is an example of "first external terminal" and the external terminal 6a is an example of "second external terminal". The terminal 21d is an example of "first terminal" and the terminal 21a is an example of "second terminal". The voltage V1 is an example of "first voltage" and the voltage V2 is an example of "second voltage". The switch 130 is an example of "first switch" and the switch 140 is an example of "second switch". The PMOS transistor 111 is an example of "first PMOS transistor" and the PMOS transistor 112 is an example of "second PMOS transistor". The logic circuit 160 is an example of "clock signal output control circuit".

As described above, in the oscillator 1 of the first embodiment, in the circuit unit 2, when the terminal 21d is the power supply terminal, the oscillation circuit 150 may be operated using the voltage V1 as the power supply voltage VDD, and the terminal 21a may function as the control terminal. Further, in the circuit unit 2, when the terminal 21d is the voltage input terminal, the terminal 21a may function as the power supply terminal and the oscillation circuit 150 may be operated using the voltage V2 as the power supply voltage VDD. Therefore, according to the oscillator 1 of the first embodiment, whether the external terminal 6d coupled to the terminal 21d functions as the power supply terminal or the voltage input terminal may be selected and whether the external terminal 6a coupled to the terminal 21a functions as the control terminal or the power supply terminal may be selected according to the voltage V1.

According to the configuration, the oscillator 1 of the first embodiment may be adaptable to a case where a plurality of types of land patterns in mounting boards are assumed. Examples of the plurality of types of land patterns are shown in Table 1. For example, as a mounting board having a first land pattern, a printed board in which a control voltage is applied to a mounted electrode corresponding to the external terminal 6a, the ground voltage GND is applied to a mounted electrode corresponding to the external terminal 6b, a mounted electrode corresponding to the external terminal 6c is an electrode for clock signal OUT, and the power supply voltage VDD is applied to a mounted electrode corresponding to the external terminal 6d is assumed. Further, as a mounting board having a second land pattern, a printed board in which the power supply voltage VDD is applied to a mounted electrode corresponding to the external terminal 6a, a mounted electrode corresponding to the external terminal 6c is an electrode for clock signal OUT, and the ground voltage GND is applied to mounted electrodes corresponding to the external terminal 6b and the external terminal 6d is assumed. The oscillator 1 of the first embodiment may operate without any problem when mounted on the first land pattern or when mounted on the second land pattern.

TABLE 1

| External terminal | First land pattern | Second land pattern |
|---|---|---|
| 6a | OE/ST | VDD |
| 6b | GND | GND |
| 6c | OUT | OUT |
| 6d | VDD | GND |

As described above, the oscillator 1 of the first embodiment may realize a plurality of different terminal arrangements without changing the internal structure thereof, and thereby, it is not necessary to manufacture two types of oscillators 1 having different terminal arrangements and internal structures and the manufacturing cost and the stock management cost are reduced. Further, according to the oscillator 1 of the first embodiment, in the circuit unit 2, the selection circuit 100 controls the switches 130, 140 based on the voltage V1 applied to the terminal 21d, and thereby, it is not necessary to store information for selection of the functions of the terminals 21d, 21a in the non-volatile memory 170 in advance and the manufacturing cost is reduced.

In the oscillator 1 of the first embodiment, in the circuit unit 2, the internal voltage generation circuit 110 includes the PMOS transistor 111 coupled between the terminal 21*d* and the node N1 and the PMOS transistor 112 coupled between the terminal 21*a* and the node N1, and thereby, the internal voltage VDD_SUB with the smaller voltage drop relative to the power supply voltage VDD applied from the terminal 21*d* or the terminal 21*a* may be generated. Therefore, according to the oscillator 1 of the first embodiment, in the circuit unit 2, the leak currents in the PMOS transistor 131 and the PMOS transistor 141 operating by the internal voltage VDD_SUB are lower and the possibility that the current consumption increases due to the leak currents is reduced.

2. Second Embodiment

As below, regarding the oscillator 1 of the second embodiment, the same configurations as those of the first embodiment have the same signs and the same explanation as that of the first embodiment will be omitted or simplified, and the differences from the first embodiment will be mainly explained.

The structure of the oscillator 1 of the second embodiment is the same as that shown in FIGS. 1 to 4 and the explanation thereof is omitted. In the oscillator 1 of the second embodiment, part of the functions of the circuit unit 2 is different from that of the first embodiment.

Figure 10:
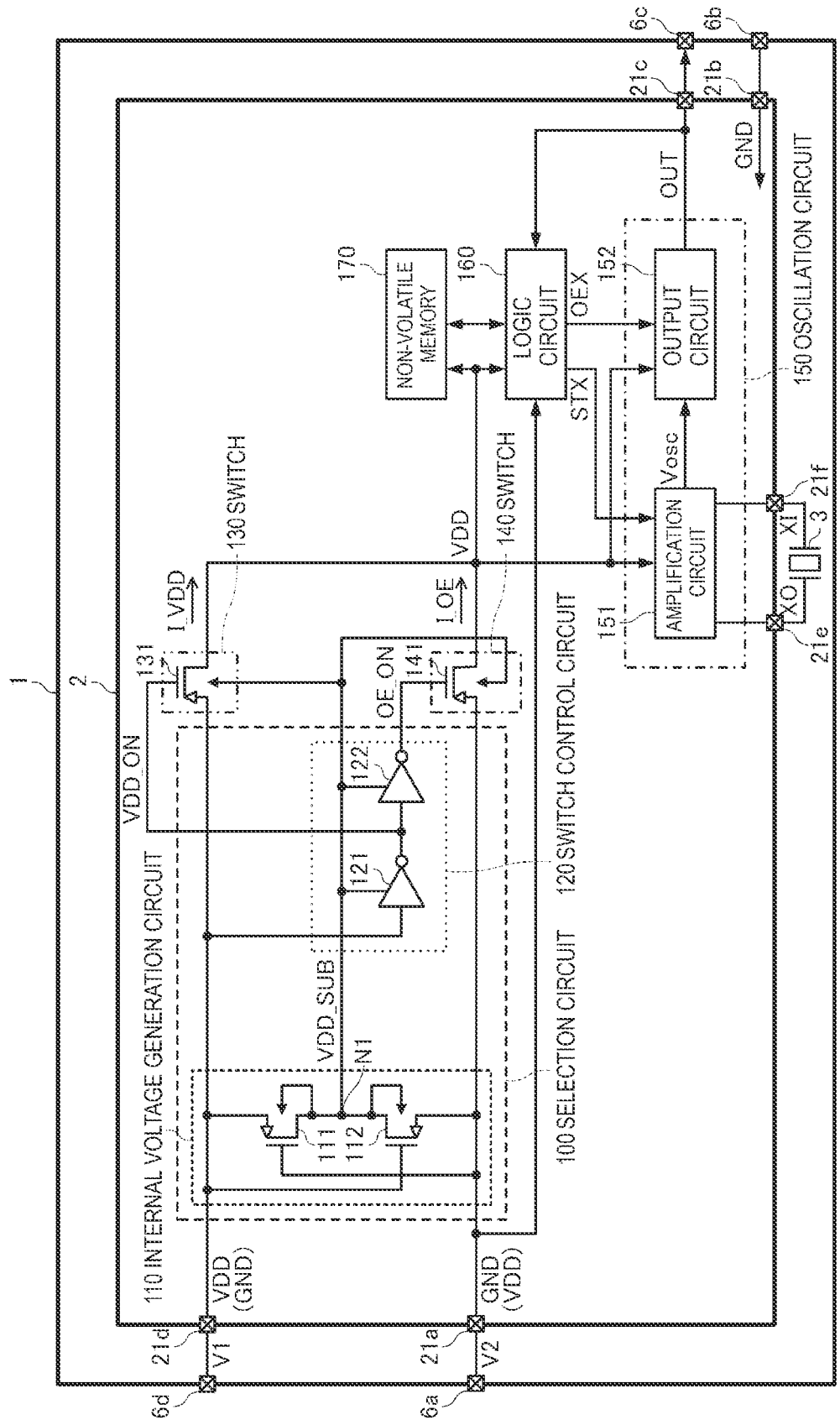
FIG. 10 is a functional block diagram of an oscillator of a second embodiment.

FIG. 10 is a functional block diagram of the oscillator 1 of the second embodiment. As shown in FIG. 10, in the oscillator 1 of the second embodiment, in the circuit unit 2, the terminal 21*d* functions as the power supply terminal or the voltage input terminal and the terminal 21*a* functions as the voltage input terminal or the power supply terminal. When the terminal 21*d* is the power supply terminal, the terminal 21*a* is the voltage input terminal. When the terminal 21*d* is the voltage input terminal, the terminal 21*a* is the power supply terminal.

When the terminal 21*d* is the power supply terminal, the voltage V1 applied to the terminal 21*d* is the power supply voltage VDD, and the PMOS transistor 112 is off. In this case, the terminal 21*a* is the voltage input terminal, and the voltage V2 applied to the terminal 21*a* is the ground voltage GND. Accordingly, the PMOS transistor 111 is on and the voltage at the node N1 is the power supply voltage VDD as the voltage V1.

On the other hand, when the terminal 21*d* is the voltage input terminal, the voltage V1 applied to the terminal 21*d* is the ground voltage GND, and the PMOS transistor 111 is on. In this case, the terminal 21*a* is the power supply terminal, and the voltage V2 applied to the terminal 21*a* is the power supply voltage VDD and the PMOS transistor 111 is off. Therefore, the voltage at the node N1 is the power supply voltage VDD as the voltage V2.

That is, as is the case for the first embodiment, regardless of whether the terminal 21*d* is the power supply terminal or the voltage input terminal, the internal voltage VDD_SUB as the voltage at the node N1 is the power supply voltage VDD. The configuration of the selection circuit 100 is the same as that in FIG. 5 and, regardless of whether the terminal 21*d* is the power supply terminal or the voltage input terminal, the power supply voltage VDD is supplied to the oscillation circuit 150 and the oscillation circuit 150 operates.

Further, regardless of whether the terminal 21*a* is the voltage input terminal or the power supply terminal, the logic circuit 160 generates the control signal STX being constantly inactive and outputs the signal to the amplification circuit 151 of the oscillation circuit 150. Furthermore, the logic circuit 160 generates the control signal OEX being constantly active and outputs the signal to the output circuit 152 of the oscillation circuit 150. Therefore, the clock signal OUT is constantly output from the oscillation circuit 150.

The rest of the configuration of the oscillator 1 of the second embodiment is the same as that of the first embodiment and the explanation thereof will be omitted.

Note that, in the second embodiment, the external terminal 6*d* is an example of "first external terminal" and the external terminal 6*a* is an example of "second external terminal". The terminal 21*d* is an example of "first terminal" and the terminal 21*a* is an example of "second terminal". The voltage V1 is an example of "first voltage" and the voltage V2 is an example of "second voltage". The switch 130 is an example of "first switch" and the switch 140 is an example of "second switch". The PMOS transistor 111 is an example of "first PMOS transistor" and the PMOS transistor 112 is an example of "second PMOS transistor". The logic circuit 160 is an example of "clock signal output control circuit".

As described above, in the oscillator 1 of the second embodiment, in the circuit unit 2, when the terminal 21*d* is the power supply terminal, the oscillation circuit 150 may be operated using the voltage V1 as the power supply voltage VDD, and the terminal 21*a* may function as the voltage input terminal. Further, in the circuit unit 2, when the terminal 21*d* is the voltage input terminal, the terminal 21*a* may function as the power supply terminal and the oscillation circuit 150 may be operated using the voltage V2 as the power supply voltage VDD. Therefore, according to the oscillator 1 of the second embodiment, whether the external terminal 6*d* coupled to the terminal 21*d* functions as the power supply terminal or the voltage input terminal may be selected and whether the external terminal 6*a* coupled to the terminal 21*a* functions as the voltage input terminal or the power supply terminal may be selected according to the voltage V1.

As described above, the oscillator 1 of the second embodiment may realize a plurality of different terminal arrangements without changing the internal structure thereof, and thereby, it is not necessary to manufacture two types of oscillators having different terminal arrangements and internal structures and the manufacturing cost and the stock management cost are reduced. Further, according to the oscillator 1 of the second embodiment, in the circuit unit 2, the selection circuit 100 controls the switches 130, 140 based on the voltage V1 applied to the terminal 21*d*, and thereby, it is not necessary to store information for selection of the functions of the terminals 21*d*, 21*a* in the non-volatile memory 170 in advance and the manufacturing cost is reduced.

In the oscillator 1 of the second embodiment, in the circuit unit 2, the internal voltage generation circuit 110 includes the PMOS transistor 111 coupled between the terminal 21*d* and the node N1 and the PMOS transistor 112 coupled between the terminal 21*a* and the node N1, and thereby, the internal voltage VDD_SUB with the smaller voltage drop relative to the power supply voltage VDD applied from the terminal 21*d* or the terminal 21*a* may be generated. Therefore, according to the oscillator 1 of the second embodiment, in the circuit unit 2, the leak currents in the PMOS transistor 131 and the PMOS transistor 141 operating by the internal voltage VDD_SUB are lower and the possibility that the current consumption increases due to the leak currents is reduced.

3. Modified Examples

The present disclosure is not limited to the embodiments and various modifications can be made within the scope of the present disclosure.

Figure 11:
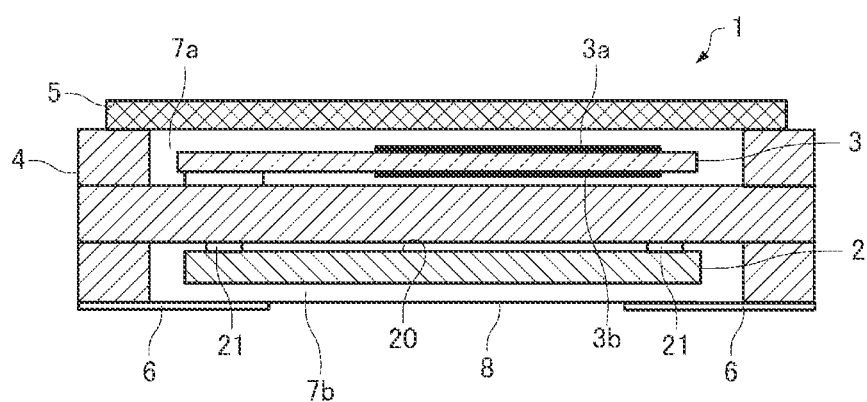
FIG. 11 is a sectional view of an oscillator of a modified example.

For example, the oscillators 1 of the above described respective embodiments are not limited to the structure shown in FIGS. 1 to 4. For example, the oscillators 1 may have a structure shown in FIG. 11. In FIG. 11, the same component elements as those in FIG. 2 have the same signs. The oscillator 1 shown in FIG. 11 is an oscillator having an H-shaped structure. In the container 4, two concave portions are provided in opposing surfaces, one concave portion is covered by the lid 5 to form a housing chamber 7a, and the other concave portion is covered by a sealing member 8 to form a housing chamber 7b. The vibrator 3 is housed in the housing chamber 7a and the circuit unit 2 is housed in the housing chamber 7b.

Figure 12:
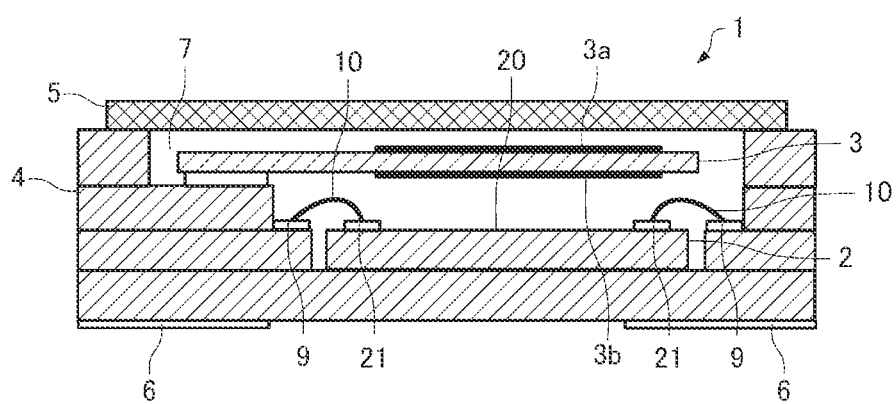
FIG. 12 is a sectional view of an oscillator of the modified example.

For example, the oscillators 1 of the above described respective embodiments may have a structure shown in FIG. 12. In FIG. 12, the same component elements as those in FIG. 2 have the same signs. In the oscillator 1 shown in FIG. 12, the circuit unit 2 is mounted so that the bottom surface 20 may face the vibrator 3. In the container 4, six electrodes 9 are formed and the respective electrodes 9 are coupled to the respective terminals 21 provided on the bottom surface 20 of the circuit unit 2 by respective bonding wires 10. The four electrodes 9 formed in the container 4 are respectively electrically coupled to the four external terminals 6 provided on the bottom surface of the container 4 by wires (not shown). Further, the two electrodes 9 formed in the container 4 are respectively electrically coupled to the excitation electrodes 3a, 3b of the vibrator 3 by wires (not shown).

Figure 13:
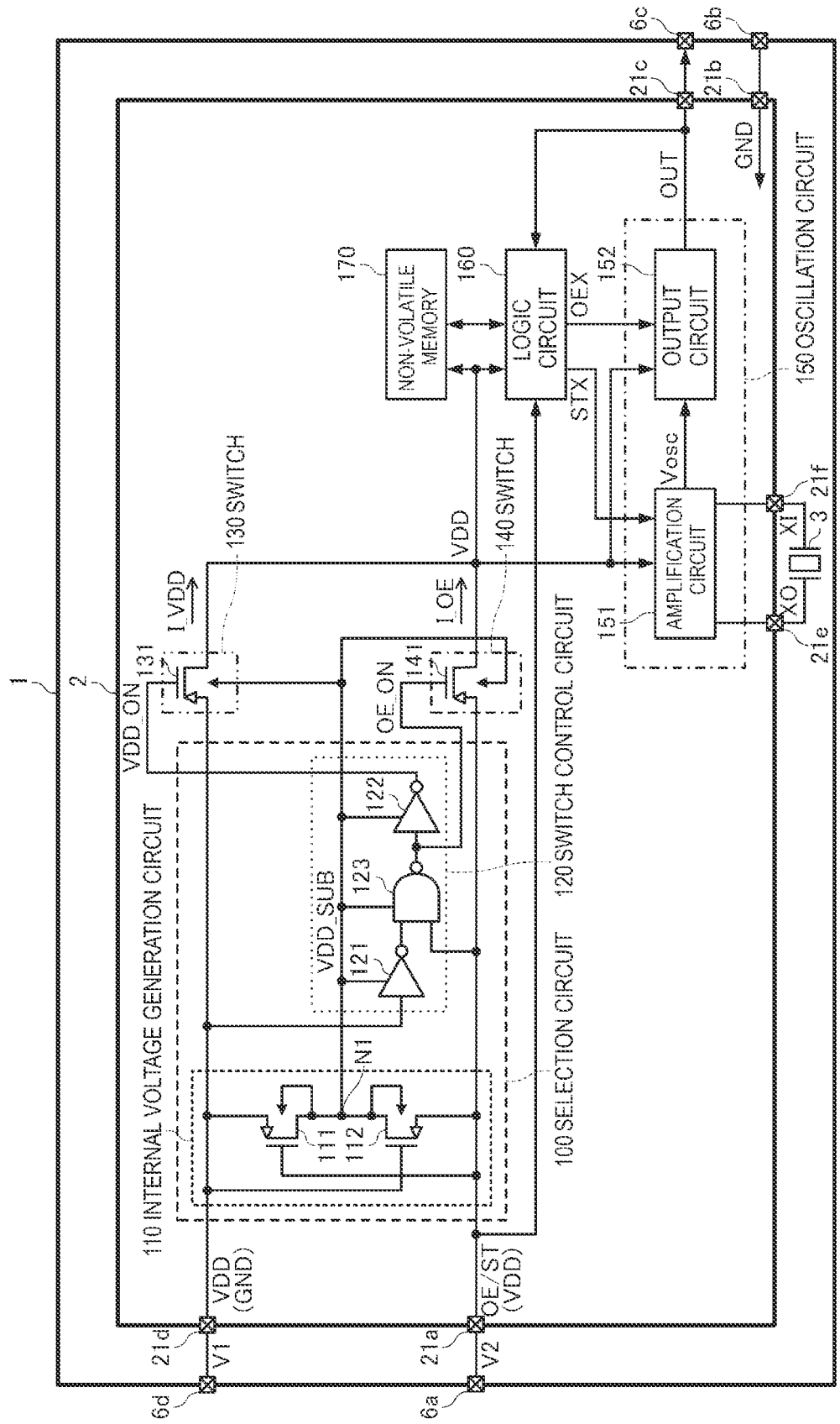
FIG. 13 is a functional block diagram of the oscillator of the modified example.

Further, for example, in the above described respective embodiments, in the circuit unit 2, when the voltage V1 applied to the terminal 21d is the power supply voltage VDD, if the voltage V2 applied to the terminal 21a is the ground voltage GND, the switch control circuit 120 turns on the PMOS transistor 141. For example, when the voltage V2 applied to the terminal 21a is the ground voltage GND, the switch control circuit 120 may turn off the PMOS transistor 141. FIG. 13 is a functional block diagram of the oscillator 1 of the modified example. In FIG. 13, the same component elements as those in FIG. 5 have the same signs. In the oscillator 1 shown in FIG. 13, in the circuit unit 2, the switch control circuit 120 includes a NAND circuit 123 in addition to the logic inverting circuits 121, 122. The logic inverting circuits 121, 122 and the NAND circuit 123 are provided with the internal voltage VDD_SUB and operate. The input terminal of the logic inverting circuit 121 is coupled to the terminal 21d, and the output terminal of the logic inverting circuit 121 is coupled to the first input terminal of the NAND circuit 123. The second input terminal of the NAND circuit 123 is coupled to the terminal 21a and the output terminal of the NAND circuit 123 is coupled to the input terminal of the logic inverting circuit 122 and the gate of the PMOS transistor 141. The output terminal of the logic inverting circuit 122 is coupled to the gate of the PMOS transistor 131. Therefore, when the voltage V2 applied to the terminal 21a is the ground voltage GND, the output signal of the NAND circuit 123 is at the high level and the PMOS transistor 131 is off.

Furthermore, in the above described respective embodiments, in the external communication mode, the serial clock signal is input from the terminal 21c to the circuit unit 2 and the serial data signal is input to or output from the terminal 21a, however, the terminals to or from which the serial clock signal and the serial data signal are input or output may be other terminals.

The oscillators 1 of the above described respective embodiments are simple oscillators such as SPXOs, however, may be oscillators having temperature compensation functions such as TCXOs or oscillators having frequency control functions such as VCXOs. SPXO is an abbreviation for Simple Packaged Crystal Oscillator. TCXO is an abbreviation for Temperature Compensated Crystal Oscillator. VCXO is an abbreviation for Voltage Controlled Crystal Oscillator. Or, the oscillators 1 may be oscillators having temperature compensation functions and frequency control functions such as VC-TCXOs or oscillators having temperature control functions such as OCXOs. VC-TCXO is an abbreviation for Voltage Controlled Temperature Compensated Crystal Oscillator. OCXO is an abbreviation for Oven Controlled Crystal Oscillator.

The above described embodiments and modified examples are just examples and the present disclosure is not limited to those. For example, the respective embodiments and the respective modified examples can be appropriately combined.

The present disclosure includes substantially the same configurations as the configurations described in the embodiments e.g., configurations having the same functions, methods, and results or configurations having the same purposes and effects. Further, the present disclosure includes configurations formed by replacement of the non-essential parts of the configurations described in the embodiments. Furthermore, the present disclosure includes configurations exerting the same functions and effects or configurations achieving the same purposes as those of the configurations described in the embodiments. In addition, the present disclosure includes configurations formed by addition of known techniques to the configurations described in the embodiments.

The following configurations are derived from the above described embodiments and modified examples.

An aspect of a circuit unit includes a first terminal functioning as a power supply terminal or a voltage input terminal, to which a first voltage is applied, a second terminal to which a second voltage is applied, an oscillation circuit oscillating a vibrator, a first switch electrically coupling or decoupling the first terminal and the oscillation circuit, a second switch electrically coupling or decoupling the second terminal and the oscillation circuit, and a selection circuit controlling the first switch and the second switch based on the first voltage and supplying one of the first voltage and the second voltage as a power supply voltage to the oscillation circuit.

In the circuit unit, when the first terminal is a power supply terminal, the oscillation circuit may be operated using the first voltage as a power supply voltage, and when the first terminal is a voltage input terminal, the oscillation circuit may be operated using the second voltage as a power supply voltage. Therefore, according to the circuit unit, whether the first terminal functions as a power supply terminal or a voltage input terminal may be selected according to the first voltage.

Further, according to the circuit unit, the selection circuit controls the first switch and the second switch based on the first voltage applied to the first terminal, and thereby, it is not necessary to store information for selection of the function of the first terminal in a non-volatile memory in advance and the manufacturing cost is reduced.

In the aspect of the circuit unit, when the first terminal functions as the power supply terminal, the second terminal may function as a control terminal and, when the first terminal functions as the voltage input terminal, the second terminal may function as a power supply terminal.

In the circuit unit, when the first terminal is the power supply terminal, the oscillation circuit may be operated using the first voltage as the power supply voltage, and the second terminal may function as the control terminal. Further, when the first terminal is the voltage input terminal, the second terminal may function as the power supply terminal and the oscillation circuit may be operated using the second voltage as the power supply voltage. Therefore, according to the circuit unit, whether the first terminal functions as the power supply terminal or the voltage input terminal may be selected and whether the second terminal functions as the control terminal or the power supply terminal may be selected according to the first voltage.

The aspect of the circuit unit may include a clock signal output control circuit coupled to the second terminal and switching whether a clock signal is output from the oscillation circuit according to the second voltage.

In the circuit unit, when the first terminal is the power supply terminal, the oscillation circuit may be operated using the first voltage as the power supply voltage, and the second terminal may function as a terminal for controlling output of the clock signal. Further, when the first terminal is the voltage input terminal, the oscillation circuit may be operated using the second voltage as the power supply voltage. Therefore, according to the circuit unit, whether the first terminal functions as the power supply terminal or the voltage input terminal may be selected and whether the second terminal functions as the terminal for output control or the power supply terminal may be selected according to the first voltage.

In the aspect of the circuit unit, the selection circuit may include an internal voltage generation circuit generating an internal voltage based on the first voltage and the second voltage, and a switch control circuit operating by the internal voltage and controlling the first switch and the second switch.

In the aspect of the circuit unit, the internal voltage generation circuit includes a first PMOS transistor having a source coupled to the first terminal and a gate coupled to the second terminal, and a second PMOS transistor having a source coupled to the second terminal and a gate coupled to the first terminal, wherein the internal voltage may be a voltage at a node at which a drain of the first PMOS transistor and a drain of the second PMOS transistor are coupled.

According to the circuit unit, in comparison with a case where the first PMOS transistor and the second PMOS transistor are respectively replaced by diodes, the internal voltage with a smaller voltage drop relative to the power supply voltage applied from the first terminal or the second terminal may be generated. Therefore, leak currents in the first switch and the second switch operating by the internal voltage are lower and the possibility that the current consumption increases due to the leak currents is reduced.

In the aspect of the circuit unit, when the first terminal functions as a power supply terminal, the second terminal may function as a voltage input terminal, and when the first terminal functions as a voltage input terminal, the second terminal may function as a power supply terminal.

In the circuit unit, when the first terminal is the power supply terminal, the oscillation circuit may be operated using the first voltage as the power supply voltage, and the second terminal may function as the voltage input terminal. Further, when the first terminal is the voltage input terminal, the second terminal may function as the power supply terminal and the oscillation circuit may be operated using the second voltage as the power supply voltage. Therefore, according to the circuit unit, whether the first terminal functions as the power supply terminal or the voltage input terminal may be selected and whether the second terminal functions as the voltage input terminal or the power supply terminal may be selected according to the first voltage.

An aspect of a vibrator device includes a vibrator, a circuit unit electrically coupled to the vibrator, and a container housing the vibrator and the circuit unit and provided with a first external terminal and a second external terminal, wherein the circuit unit includes a first terminal electrically coupled to the first external terminal and functioning as a power supply terminal or a voltage input terminal, to which a first voltage is applied, a second terminal electrically coupled to the second external terminal, to which a second voltage is applied, an oscillation circuit oscillating the vibrator, a first switch electrically coupling or decoupling the first terminal and the oscillation circuit, a second switch electrically coupling or decoupling the second terminal and the oscillation circuit, and a selection circuit controlling the first switch and the second switch based on the first voltage and supplying one of the first voltage and the second voltage as a power supply voltage to the oscillation circuit.

In the vibrator device, in the circuit unit, when the first terminal is a power supply terminal, the oscillation circuit may be operated using the first voltage as a power supply voltage, and when the first terminal is a voltage input terminal, the oscillation circuit may be operated using the second voltage as a power supply voltage. Therefore, according to the vibrator device, whether the first external terminal coupled to the first terminal functions as a power supply terminal or a voltage input terminal may be selected according to the first voltage. As described above, the vibrator device may realize a plurality of different terminal arrangements without changing the internal structure thereof, and thereby, it is not necessary to manufacture two types of vibrator devices having different terminal arrangements and internal structures and the manufacturing cost and the stock management cost are reduced.

In the aspect of the vibrator device, when the first terminal functions as a power supply terminal, the second terminal may function as a control terminal and, when the first terminal functions as a voltage input terminal, the second terminal may function as a power supply terminal.

In the vibrator device, in the circuit unit, when the first terminal is the power supply terminal, the oscillation circuit may be operated using the first voltage as the power supply voltage, and the second terminal may function as the control terminal. Further, when the first terminal is the voltage input terminal, the second terminal may function as the power supply terminal and the oscillation circuit may be operated using the second voltage as the power supply voltage. Therefore, according to the vibrator device, whether the first external terminal functions as the power supply terminal or the voltage input terminal may be selected and whether the second external terminal functions as the control terminal or the power supply terminal may be selected according to the first voltage.

In the aspect of the vibrator device, the circuit unit may include a clock signal output control circuit coupled to the second terminal and switching whether a clock signal is output from the oscillation circuit according to the second voltage.

In the vibrator device, in the circuit unit, when the first terminal is the power supply terminal, the oscillation circuit may be operated using the first voltage as the power supply voltage, and the second terminal may function as a terminal for controlling output of the clock signal. Further, in the circuit unit, when the first terminal is the voltage input terminal, the oscillation circuit may be operated using the second voltage as the power supply voltage. Therefore, according to the vibrator device, whether the first external terminal coupled to the first terminal functions as the power supply terminal or the voltage input terminal may be selected and whether the second external terminal coupled to the second terminal functions as the terminal for output control or the power supply terminal may be selected according to the first voltage.

What is claimed is:

1. A circuit unit comprising:
   a first terminal functioning as a power supply terminal or a voltage input terminal, to which a first voltage is applied;
   a second terminal to which a second voltage is applied;
   an oscillation circuit oscillating a vibrator;
   a first switch electrically coupling or decoupling the first terminal and the oscillation circuit;
   a second switch electrically coupling or decoupling the second terminal and the oscillation circuit; and
   a selection circuit controlling the first switch and the second switch in response to the first voltage supplied via the first terminal and supplying one of the first voltage and the second voltage as a power supply voltage to the oscillation circuit.

2. The circuit unit according to claim 1, wherein
   when the first terminal functions as a power supply terminal, the second terminal functions as a control terminal and, when the first terminal functions as a voltage input terminal, the second terminal functions as a power supply terminal.

3. The circuit unit according to claim 2, further comprising a clock signal output control circuit coupled to the second terminal and switching whether a clock signal is output from the oscillation circuit according to the second voltage.

4. The circuit unit according to claim 1, wherein
   the selection circuit includes:
   an internal voltage generation circuit generating an internal voltage based on the first voltage and the second voltage; and
   a switch control circuit operating by the internal voltage and controlling the first switch and the second switch.

5. The circuit unit according to claim 4, wherein
   the internal voltage generation circuit includes:
   a first PMOS transistor having a source coupled to the first terminal and a gate coupled to the second terminal; and
   a second PMOS transistor having a source coupled to the second terminal and a gate coupled to the first terminal, wherein
   the internal voltage is a voltage at a node at which a drain of the first PMOS transistor and a drain of the second PMOS transistor are coupled.

6. The circuit unit according to claim 1, wherein
   when the first terminal functions as a power supply terminal, the second terminal functions as a voltage input terminal, and when the first terminal functions as a voltage input terminal, the second terminal functions as a power supply terminal.

7. A vibrator device comprising:
   a vibrator;
   a circuit unit electrically coupled to the vibrator; and
   a container housing the vibrator and the circuit unit and provided with a first external terminal and a second external terminal, wherein
   the circuit unit includes
   a first terminal electrically coupled to the first external terminal and functioning as a power supply terminal or a voltage input terminal, to which a first voltage is applied,
   a second terminal electrically coupled to the second external terminal, to which a second voltage is applied,
   an oscillation circuit oscillating the vibrator,
   a first switch electrically coupling or decoupling the first terminal and the oscillation circuit,
   a second switch electrically coupling or decoupling the second terminal and the oscillation circuit, and
   a selection circuit controlling the first switch and the second switch in response to the first voltage supplied via the first terminal and supplying one of the first voltage and the second voltage as a power supply voltage to the oscillation circuit.

8. The vibrator device according to claim 7, wherein
   when the first terminal functions as a power supply terminal, the second terminal functions as a control terminal and, when the first terminal functions as a voltage input terminal, the second terminal functions as a power supply terminal.

9. The vibrator device according to claim 8, further comprising a clock signal output control circuit coupled to the second terminal and switching whether a clock signal is output from the oscillation circuit according to the second voltage.

* * * * *